United States Patent [19]

Henderson et al.

[11] 4,257,121
[45] Mar. 17, 1981

[54] PORTABLE TRANSCEIVER

[75] Inventors: Claude L. Henderson, Camby; Michael E. Shepperd, Indianapolis, both of Ind.

[73] Assignee: General Aviation Electronics, Inc., Indianapolis, Ind.

[21] Appl. No.: 909,822

[22] Filed: May 26, 1977

[51] Int. Cl.³ .............................................. H04B 1/38
[52] U.S. Cl. ..................................... 455/89; D14/92; 200/293; 455/90; 455/128; 455/351
[58] Field of Search .................... D14/92, 95; 325/16, 325/111, 119, 352, 353, 354, 355; 312/7; 343/702; 455/89, 90, 95, 128, 347, 351; 200/42 R, 293, 296, 304, 333, 334; 338/226, 315

[56] References Cited

U.S. PATENT DOCUMENTS

| | | | |
|---|---|---|---|
| 2,810,068 | 10/1957 | Weisz et al. | 250/14 |
| 3,128,431 | 4/1964 | Walker | 325/111 |
| 3,305,779 | 2/1967 | Errichiello | 325/111 |
| 3,345,568 | 10/1967 | Errichiello et al. | 455/89 |
| 3,422,358 | 1/1969 | Sabonis | 325/358 |
| 3,701,016 | 10/1972 | Bennett et al. | 325/16 |
| 3,824,465 | 7/1974 | Blough | 455/89 |
| 3,969,815 | 7/1976 | Hacke et al. | 29/625 |
| 3,977,074 | 8/1976 | Furnival | 29/625 |
| 4,053,717 | 10/1977 | Snider | 325/64 |
| 4,077,007 | 2/1978 | McKinney | 325/361 |

FOREIGN PATENT DOCUMENTS

| | | | |
|---|---|---|---|
| 811475 | 8/1951 | Fed. Rep. of Germany | 325/352 |
| 2705216 | 8/1978 | Fed. Rep. of Germany | 325/16 |

OTHER PUBLICATIONS

76' Radio Shack Electronics Catalog pp. 156-157 "Realistic TRC-27".

"Wilson T-1502 MX" Wilson Electronics Corp., P.O. Box 19000, Las Vegas, Nevada 89119.
"R. F. Communications RF-2800" 1680 University Ave., Rochester, N.Y. 14610.
"Johnson FM545" E. F. Johnson Co., Waseca, Minn. 56093.
"Sonab SC905TR" AB Sonab Fack, S-162 10 Vallingby, Sweden.
"Sony CB901" Sony Corp. of America, 580 Fifth Ave., NY, NY.
"Realistic TRC-25A" 1976 Electronics Catalog, pp. 156-157.

*Primary Examiner*—Benedict V. Safourek
*Attorney, Agent, or Firm*—Woodard, Weikart, Emhardt & Naughton

[57] ABSTRACT

A portable transceiver includes a two-piece transceiver housing which encloses a double-sided printed circuit board. The transceiver housing includes a front surface portion and a control panel portion which is integral with, but recessed below, the front surface portion. Within the control panel portion are four clearance apertures which provide operator access to the operator controls of the printed circuit board. The width and depth of the housing are suitably sized to enable the portable transceiver to be hand held in one hand while the thumb of that same hand is able to manipulate the various operator controls. These controls protrude through the various clearance apertures yet the outermost portions of the controls remain flush with to recessed below the front surface portion. The printed circuit board is a self-contained transceiver such that all wiring is completed prior to installing the printed circuit board into the transceiver housing.

14 Claims, 7 Drawing Figures

PORTABLE TRANSCEIVER

BACKGROUND OF THE INVENTION

This invention relates in general to transceivers and in particular to portable transceivers which can be held and operated by the same hand.

Portable radios which can both receive and transmit are well known in the art. Such devices have been used for some period of time as military walkie-talkies, and have become important devices to the construction industry and for security purposes as well as finding use as an amusement device for children. As the electronics industry advanced, circuitry improvements enabled the size and weight of such electronic devices to be reduced while their reliability and ease of operation improved. Most of these present day devices, typically referred to as transceivers, include a printed circuit board with a case-like housing and the necessary wiring and controls to make the device operable. The operator controls are externally actuatable and typically include such features as a push-to-talk button, on-off volume control, squelch knob and possibly a channel select switch.

The following list of patents offers some indication of the types of circuitry arrangements which have been used as well as some concepts associated with printed circuit board design.

| U.S. Pat. No. | Patentee | Issue Date |
| --- | --- | --- |
| 3,701,016 | Bennett et al. | 10/24/72 |
| 3,345,568 | Errichiello et al. | 10/03/67 |
| 3,128,431 | Walker | 4/07/64 |
| 3,305,779 | Errichiello | 2/21/67 |
| 3,969,815 | Hacke et al. | 7/20/76 |
| 3,977,074 | Furnival | 8/31/76 |

Bennett et al. discloses a portable transceiver wherein the printed circuit board is mounted to a rectangular frame which opens at the front and back sides. There are separate front and rear covers which attach to the frame to enclose the internal circuitry. The operator controls extend out from the upper edge of the frame and must be hard wired to the printed circuit board once the board is installed.

Errichiello et al. discloses a portable transceiver wherein two printed circuit boards are used and hard wired connections must be made to the operator controls after assembly of the boards to the transceiver housing. These operator controls extend out from the upper end of the housing portion and would not be operable by the same hand which holds the unit, while the unit is in use, due to the fact that the push-to-talk switch is located on the left side of the housing and the unit is held so that this switch may be thumb operated.

Walker discloses a portable transmitter wherein the particular circuitry is arranged to regulate the signal input to a power amplifier transistor according to variations in ambient temperature. The single-sided printed circuit board must be electrically coupled to the dual battery packs as well as the push-to-talk switch after installation of the printed circuit board into the housing. The unit disclosed does not receive signals and is not therefore a transceiver.

Errichiello discloses a portable transmitter which includes housing provisions for interchangeably receiving batteries and antenna subassemblies of different types. The unit disclosed is not a transceiver and consequently its relevancy as prior art to the present invention is questionable.

Hacke et al. discloses a process for forming a through connection between a pair of circuit patterns disposed on opposite surfaces of a substrate. This patent is listed only for its disclosure of a double-sided circuit connection technique. The patent does not disclose or suggest applicability to transceiver designs.

Furnival discloses a method of fabricating a double-sided printed circuit board wherein an interfacial connection is made from one etched side to the opposite side and then completed by dip soldering or by welding. This patent is also of questionable relevancy to the design of portable transceivers but is nevertheless listed in that, transceivers typically use printed circuit boards.

It is noted that none of the transceiver designs disclosed above include a completely self-contained and finished circuit which needs only to be installed in a housing for protection, but which requires no wiring after installation in order to make the transceiver operable.

There are several commercial transceivers which have been available over the past few years and which reveal a variety of package styles. Typical of such packaging variations are the following units identified in the following publications:

Wilson T-1502 MX
Wilson Electronics Corp.
P.O. Box 19000
Las Vegas, NV 89119

R. F. Communications RF-2800
1680 University Avenue
Rochester, NY 14610

Johnson FM545
E. F. Johnson Co.
Waseca, MN 56093

Sonab SC905TR
A B Sonab
Fack, S-162 10
Vallingby, Sweden

Sony CB901
Sony Corporation of America
580 Fifth Avenue
New York 36, NY

It is to be noted that although these units may offer a variety of styles, the push-to-talk button is usually on the left side (oriented with the user facing the speaker grill) with the on-off volume knob and other controls on the top end of the unit. Although such units may be hand held, all the external controls are not operable by one hand while that same hand is holding the transceiver for push-to-talk operation. Furthermore, with the push-to-talk button on the left side of the unit, the unit is designed to be held only by the left hand due to thumb control of the button and thus the units are not as versatile as they could be if the controls were all centrally located. With centrally located controls, these controls could be operated by the thumb of the hand holding the transceiver as well as be equally well suited for operation by either hand.

SUMMARY OF THE INVENTION

A portable transceiver according to one embodiment of the present invention includes a transceiver housing having a front surface portion, a transceiver circuit located within the housing, a control panel portion disposed within and recessed below the front surface portion and a plurality of operator controls protruding through the control panel portion and communicating with the transceiver circuit.

One object of the present invention is to provide an improved portable transceiver.

Another object of the present invention is to provide a portable transceiver which can be held and operated solely by either hand.

Related objects and advantages of the present invention will be apparent from the following description.

DESCRIPTION OF THE PREFERRED EMBODIMENT

Figure 1:
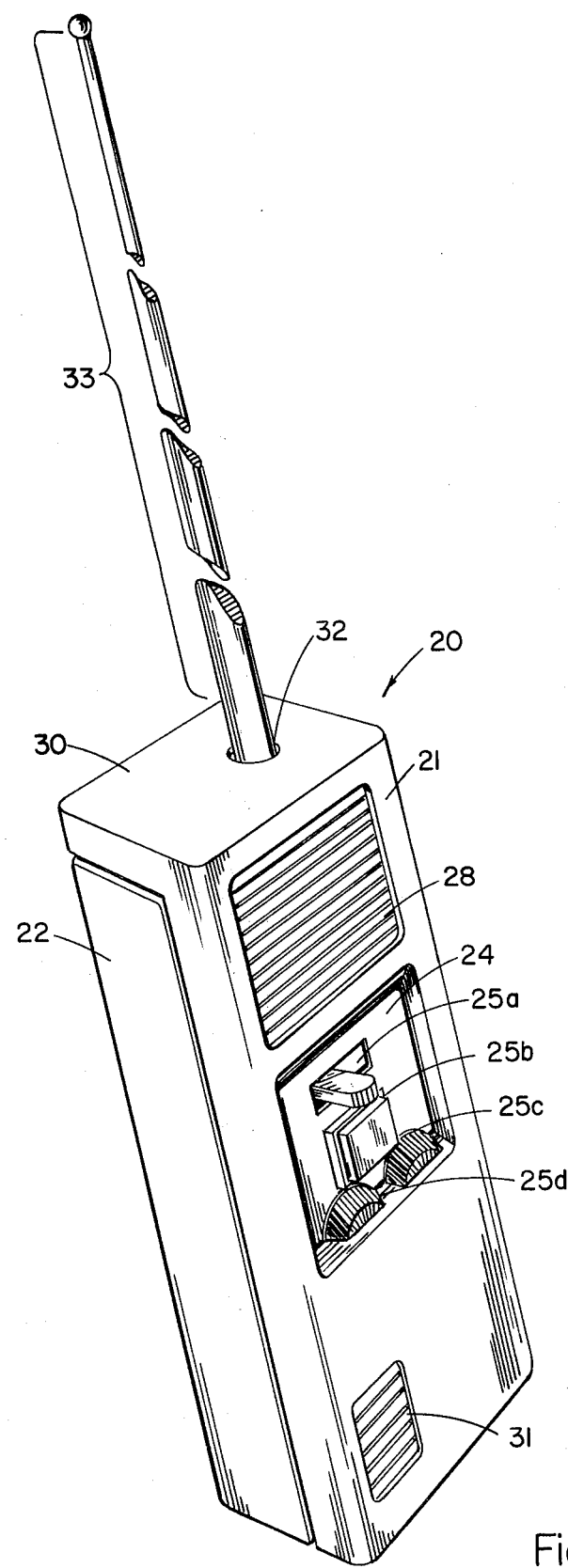
FIG. 1 is a perspective view of a portable transceiver according to a typical embodiment of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 4:
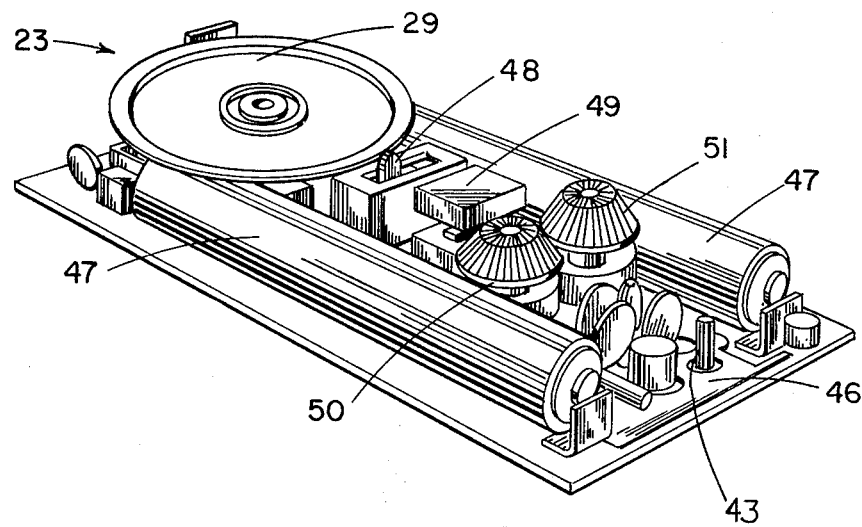
FIG. 4 is a perspective view of a printed circuit board comprising a portion of the FIG. 1 transceiver.

Referring to FIG. 1, there is illustrated a portable transceiver 20 which includes a front housing section 21 and a rear housing 22 which are joined together at their outer edges and thereby define a circuit cavity region. Mounted to rear housing section 22 and covered by front housing section 21 is a double-sided printed circuit board 23 (see FIG. 4) which includes the necessary transceiver circuitry, prewired and completely self-contained such that the front and rear housing sections provide only a convenient package for the handling, usage and protection of printed circuit board 23.

Figure 2:
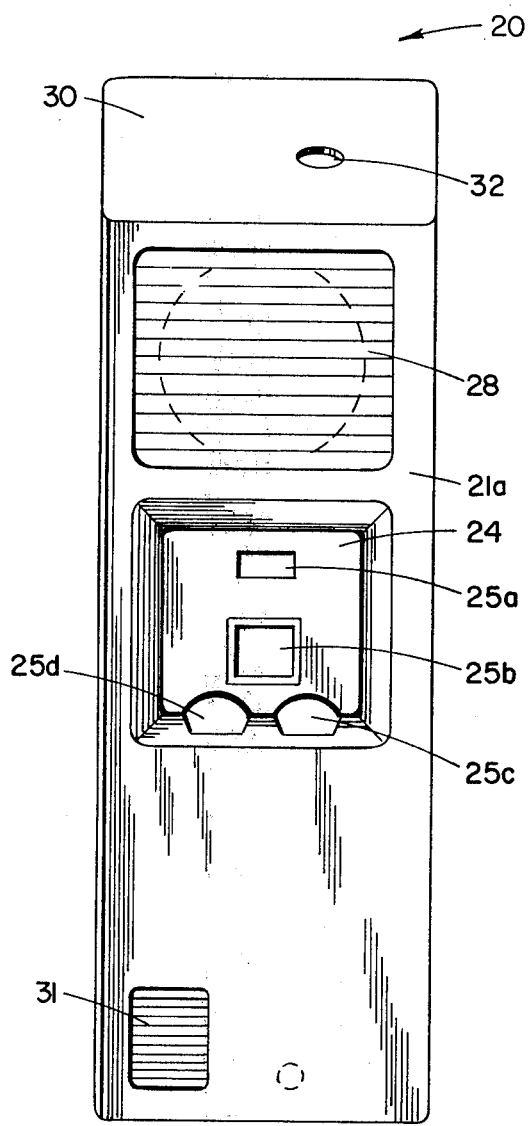
FIG. 2 is a front elevation view of a front housing section comprising a portion of the FIG. 1 transceiver.
Figure 3:
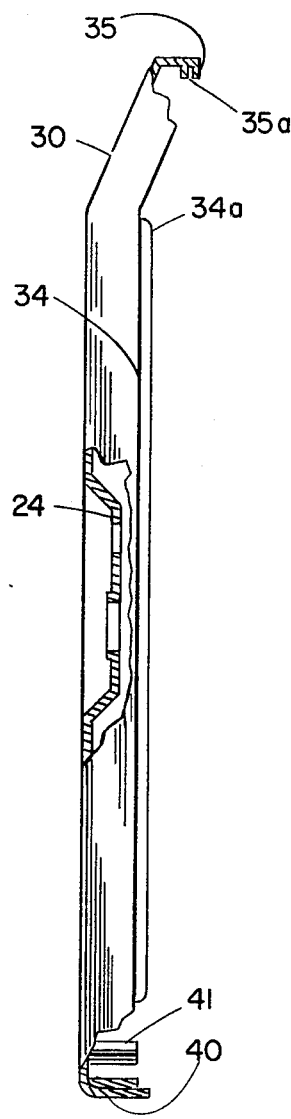
FIG. 3 is a fragmentary side elevation view of the FIG. 2 front housing section.

Front housing section 21 (see FIGS. 2 and 3) includes a control panel portion 24 which is integral with section 21, although recessed below the outermost surface 21a of section 21 by approximately 0.25 inches. Control panel portion 24 has located therein four clearance apertures 25a, 25b, 25c and 25d, which provides operator access to the transceiver controls which are mechanically and electrically coupled to the printed circuit board 23 and which protrude through the four apertures. Front housing section 21 further includes an output speaker grill 28 which is oriented directly over speaker 29 of circuit board 23 and which is located between control panel portion 24 and upper end 30. On the opposite side of control panel portion 24, from speaker grill 28, is a microphone grill 31 which is located in the lower left corner of section 21. The location and spacing of grills 28 and 31 are such that with the transceiver 20 held up to the operator's ear and with the transceiver at an approximate 45 degree incline, the microphone grill will be oriented close to the operator's mouth. This arrangement permits the operator to alternately speak and listen as the transceiver is controlled by the thumb of the hand holding the transceiver while the speaker and microphone locations are suitably close to the ear and the mouth of the operator, respectively. Upper end 30 is downwardly formed at an inclined angle relative to outer surface 21a of front housing section 21 and includes therein a clearance hole 32 for telescoping antenna 33 (see FIG. 1).

Figure 5:
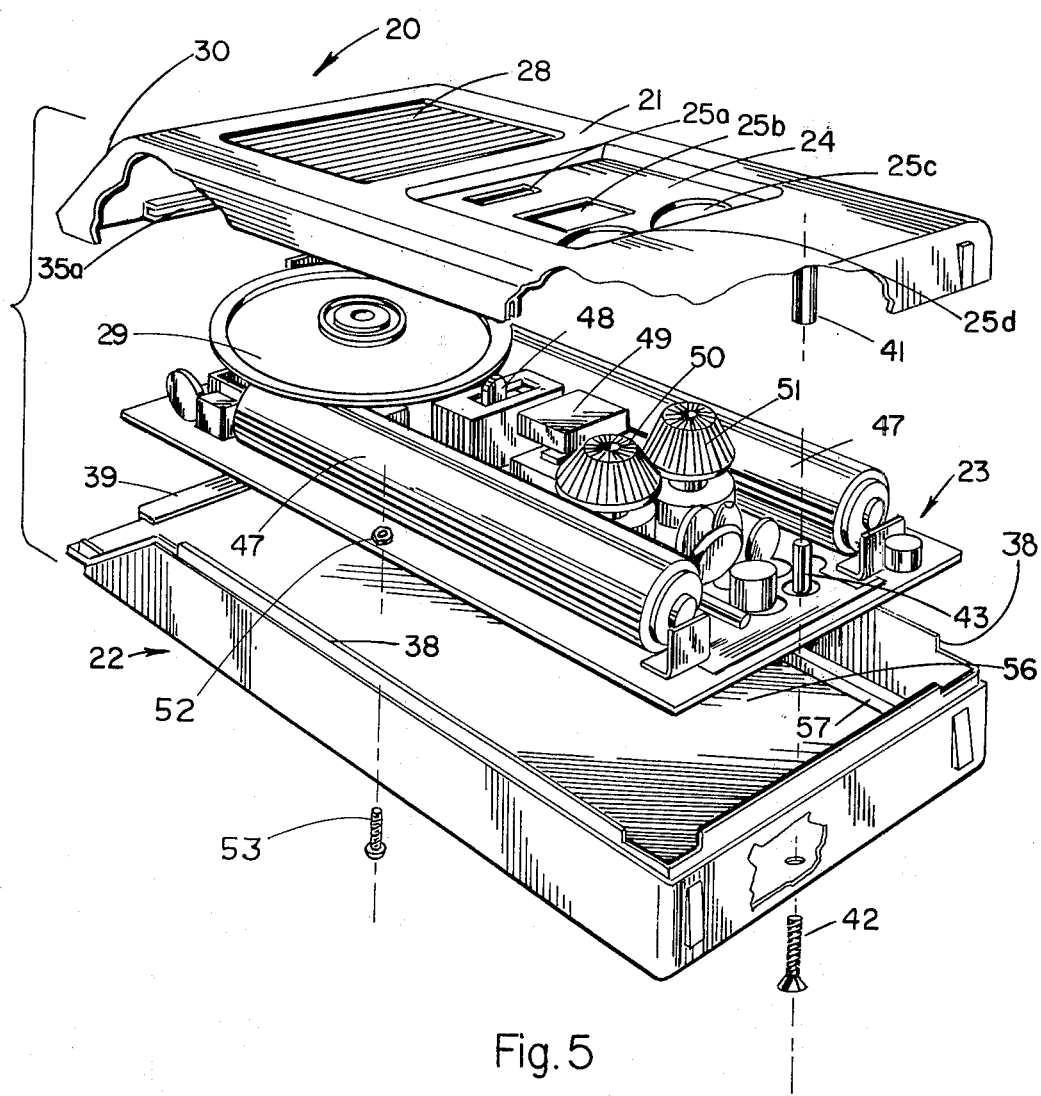
FIG. 5 is an exploded view of the FIG. 4 printed circuit board removed from a rear housing section which comprises a portion of the FIG. 1 transceiver.

Front and rear housing sections are preferably fabricated from a suitable thermoforming or thermosetting compound which may be molded into a substantially rigid member while still maintaining close tolerance control of the various features and shapes which must be molded into these two sections as will be described hereinafter. In the arrangement illustrated (see FIG. 3), side edge 34, and the corresponding edge on the opposite side, and upper edge 35 each have a groove 34a and 35a, respectively, molded therein. The correspondingly aligned edges of rear housing section 22 (see FIG. 5) have longitudinally extending tabs 38 and laterally extending tab 39 which snap into the corresponding grooves of section 21 for a tightly sealed enclosure. This type of snap-together part molding is well known in the plastic molding art and further details of such an assembly technique are not necessary. The fit of tab 39 into groove 35a is in the longitudinal direction with respect to transceiver 20 and thus prevents separation of the two housing sections in a direction normal to outermost surface 21a. However, the lower end 40 of section 21 is not similarly arranged to the top end 30, but rather includes an internally threaded spacer 41, which receives a screw 42 that extends through rear housing section 22 and hollow spacer 43 on circuit board 23. This fastening arrangement securely draws the two housing sections together at this one edge location where tabs and grooves are not present.

Housing section 21 includes two side and two end wall portions integrally joined together into a generally rectangular frame-like shape. This section is completed by the addition of outer surface 21a. Section 22 also includes two side wall portions and an end wall portion. Once the two sections are joined together, the various side wall portions and end wall portions create side and end surface portions of the entire transceiver housing and define an enclosed void therebetween. The outer surface 21a and the opposite rear surface are generally rectangular in shape and comparatively larger in total area than any of the other side wall or end wall surface portions.

Printed circuit board 23 includes double-sided printed wire board 46, speaker 29, two battery-packs 47, channel select slide switch 48, movable to one of four different channels, push-to-talk momentary push button 49, on-off volume rotary switch 50 and squelch control rotary switch 51. The remainder of the circuitry includes a suitable arrangement of resistors, capacitors, diodes, transistors and solid state integrated circuits in order to structure a transceiver circuit as is well known in the art. At three locations around the outer edge of printed circuit board 23 are stake nuts 52 which are rigidly attached to board 23. These stake nuts receive screws 53 which extend through rear housing section 22 and thus draw printed circuit board 23 against rear housing section 22. The inwardly facing bottom surface 56 of section 22 has disposed thereon a perimeter ledge 57 on which the outer edge of printed circuit board 23 rests such that component leads which extend through printed wiring board 46 will be spaced apart from surface 56. Consequently the leads of the various components which extend through board 46 will not make contact with surface 56 which might subject such leads to compressive or bending forces which might tend to weaken the solder bond around these leads.

Printed circuit board 23 may include antenna 33 prior to assembly into front and rear housing sections or antenna 33 may be screwed into position and its wire coupled to printed circuit board 23 by a spring clip after printed circuit board 23 is installed. The important feature is that printed circuit board 23 includes the complete circuitry for transceiver 20 and as such, neither the wiring to the operator controls nor any other electrical connecting is required after the printed circuit board is mounted to rear housing section 22. As previously discussed, front and rear housing sections 21 and 22, respectively, provide a convenient package for the handling and protection of transceiver printed circuit board 23.

Figure 6:
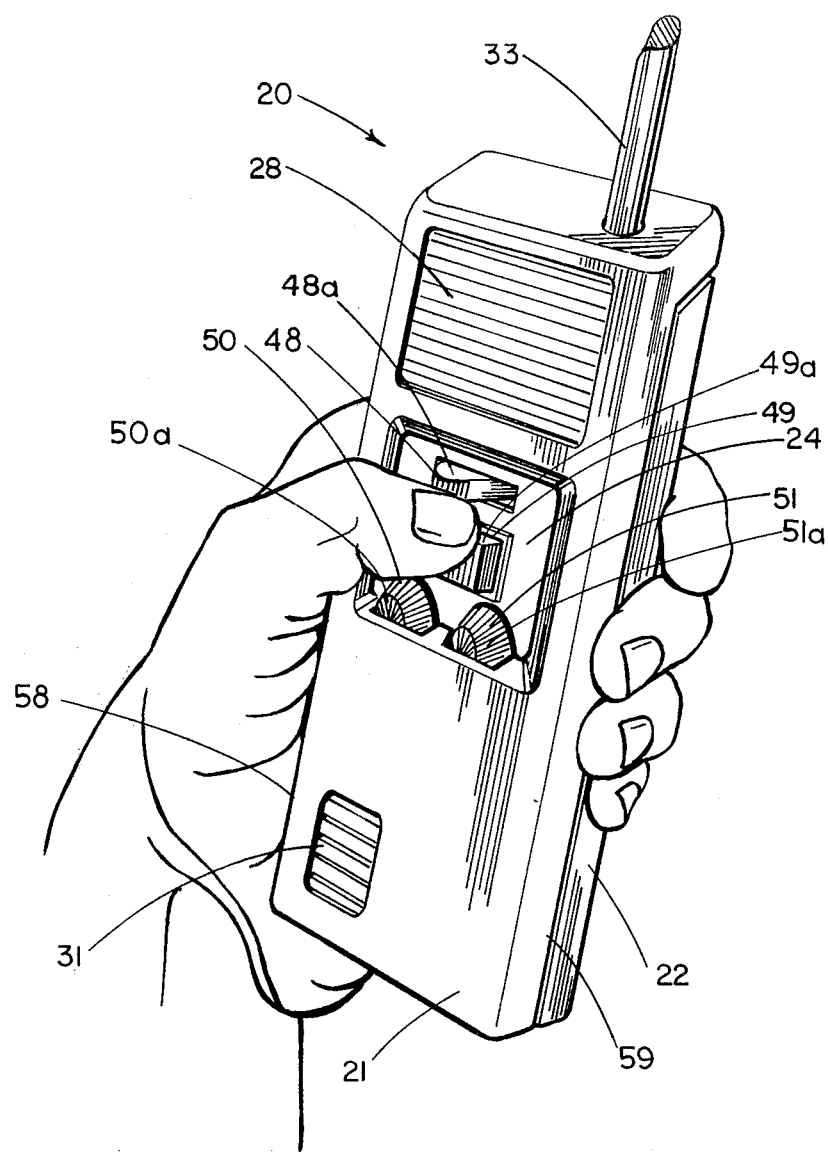
FIG. 6 is a perspective view of the FIG. 1 transceiver being hand held and thumb operated.
Figure 7:
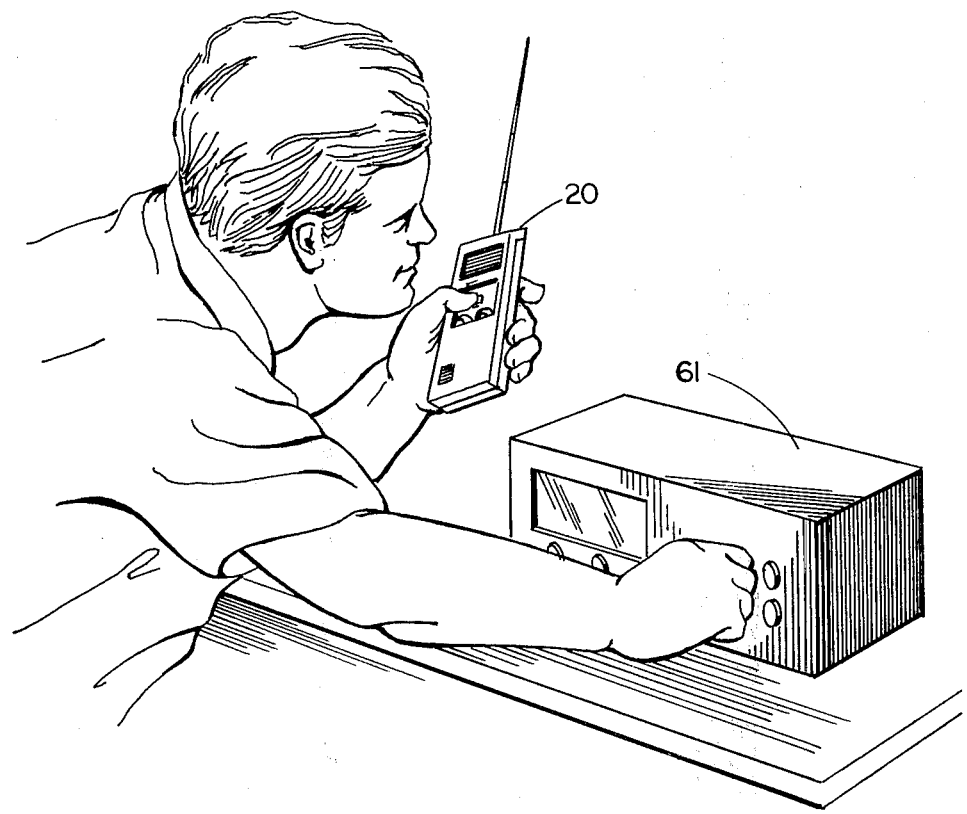
FIG. 7 is a perspective view of the FIG. 1 transceiver being held and operated by the left hand with the right hand free for another activity.

The width and thickness of transceiver 20 is suitable for the unit to be comfortably and securely hand held between the fingers and palm of one hand of the operator (see FIG. 6). In this hand held orientation, the thumb of the same hand will be positionable directly over control panel portion 24 such that the four protruding operator controls 48, 49, 50 and 51 can all be easily actuated by the thumb. The four controls have been selected with a variety of knob shapes as well as a variety of directions of movement for actuation. In this manner, the operator is able to tell by the feel of the knob which control is being touched and what type of movement must be made in order to actuate that control or to select a particular condition or mode of operation. Although the knob portions 50a and 51a of controls 50 and 51, respectively, are similarly shaped, their side-by-side location is sufficient to enable the operator to distinguish between them even without making visual contact. The controls and their corresponding knob portions 48a, 49a, 50a and 51a, respectively, each have a sufficient separation from each other so that the desired knob can be maneuvered without altering or influencing another setting. A further human engineering consideration taken into account by the design of transceiver 20 is the symmetrical locating of the controls between sides 58 and 59 of transceiver 20. This symmetrical locating of the controls is best understood by realizing that controls 48 and 49 are located substantially on the longitudinal centerline of transceiver 20 and that controls 50 and 51 are substantially evenly spaced on opposite sides of this centerline. Although FIG. 6 illustrates transceiver 20 as being held by the operator's left hand, the transceiver could equally be held with the right hand and similarly operated by the thumb of the right hand. In this manner, one style of transceiver is suitable for all persons whether left-handed or right-handed, and use by one hand alone permits the other hand to be free for some other activity such as writing, using a weapon or operating a machine or similar device. As illustrated by FIG. 7, the operator of transceiver 20 may be taking directions and communicating with a remote location relative to the operation of a piece of equipment 61 as his right hand operates various controls of the piece of equipment 61 as the directions are taken. Consequently, the design of transceiver 20 permits normal activities as well as emergency activities to be carried on without having to interrupt the communications relative to such activities in order to select a different channel, turn the volume up or down or adjust the squelch control. The transceiver is fully operational by the hand which is doing the holding and such a transceiver could be easily used by a person with impaired sight.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A portable transceiver for communication between a user location and at least one remote location, said transceiver comprising:
   a transceiver housing having two side surface portions and two end surface portions configured into a generally rectangular shape and enclosed by comparatively larger, generally rectangular, front surface and rear surface portions;
   a transceiver circuit located within said housing;
   a control panel portion disposed within and recessed below said front surface portion; and
   a plurality of operator controls communicating with said transceiver circuit and providing for the complete operation of said portable transceiver by the user, every control of said plurality of operator controls protruding through said control panel portion and positioned flush with to recessed below said front surface portion.

2. The portable of claim 1 wherein the width and depth of said transceiver housing are suitably sized to enable gripping of said transceiver between the fingers and the palm of one hand of the user, wherein the rear surface portion directly faces the palm of said one hand so that said front surface portion faces outwardly and is accessible for manipulation of said operator controls.

3. The portable transceiver of claim 1 wherein each of said operator controls being designed and arranged so as to be randomly and repeatedly operable by the thumb of said one hand when said transceiver is being gripped by said one hand without changing the grip of said one hand.

4. The portable transceiver of claim 3 wherein said transceiver housing includes a front housing section and a rear housing section aligned with and joined to said front housing section, said front surface portion being integral with said front housing section.

5. The portable transceiver of claim 4 wherein said plurality of operator controls include a channel select switch, said transceiver being operable on a plurality of different channels.

6. The portable transceiver of claim 5 wherein said transceiver circuit is arranged on a printed circuit board, said printed circuit board being mounted within said rear housing section and covered by said front housing section.

7. The portable transceiver of claim 6 wherein said transceiver circuit includes an output speaker and said front surface portion includes a grill disposed atop said speaker, said grill being adjacent said control panel portion.

8. The portable transceiver of claim 7 wherein said plurality of operator controls further include a push-to-talk button, an on-off volume knob and a squelch knob.

9. The portable transceiver of claim 1 wherein said plurality of operator controls include a channel select switch and a push-to-talk button located substantially on the longitudinal centerline of said portable transceiver and an on-off volume knob and a squelch knob symmetrically located on opposite sides of said centerline.

10. A portable transceiver for communication between remote locations, said transceiver comprising:
a front housing section including two side wall portions and two end wall portions integrally joined together into a generally rectangular frame and integral therewith, and of a comparative larger size, a substantially rectangular front surface portion;
a rear housing section including two side wall portions and an end wall portion integrally joined together and integral therewith, and of a comparatively larger size, a substantially rectangular rear surface portion, said side wall portions and said end wall portion of said rear housing section being suitably adapted to fit together with said front housing section;
means for joining said front and rear housing sections together;
a transceiver circuit disposed on a printed circuit board, said printed circuit board being mounted to said rear housing section and covered by said front housing section;
a control panel portion disposed within and recessed below said front surface portion; and
a plurality of operator controls communicating with said transceiver circuit and providing for the complete operation of said portable transceiver by the user, every control of said plurality of operator controls protruding through said control panel portion and positioned flush with to recessed below said front surface portion.

11. The portable transceiver of claim 10 wherein said control panel portion includes a plurality of openings, there being one such opening for each one of said plurality of operator controls, said plurality of operator controls being mechanically and electrically coupled to said printed circuit board.

12. The portable transceiver of claim 11 wherein said printed circuit board is designed and arranged as a completely self-contained transceiver circuit such that all wiring is completed prior to said printed circuit board being enclosed by said front and rear housing sections.

13. A portable transceiver for communication between a user location and at least one remote location, said transceiver comprising:
a transceiver housing having two side surface portions and two end surface portions joined together into a generally rectangular shape which is enclosed by comparatively larger, generally rectangular front surface and rear surface portions, said transceiver housing being of a size suitable to be held in the palm of a hand whereby said rear surface portion directly faces the palm of said hand;
a transceiver circuit located within said housing;
a control panel portion centrally disposed within and recessed below said front surface portion, said recessed control panel portion being surrounded by said front surface portion; and
a plurality of operator controls communicating with said transceiver circuit and providing for the complete operation and said portable transceiver by the user, every control of said plurality of operator controls being spaced apart from one another for independent operation and protruding through said recessed control panel portion and positioned flush with to recessed below said front surface portion.

14. A portable transceiver for communication between a user location and at least one remote location, said transceiver comprising:
a transceiver housing having two side surface portions and two end surface portions configured into a generally rectangular shape which is enclosed by comparatively larger, generally rectangular front surface and rear surface portions;
a transceiver circuit located within said housing;
a control panel portion disposed within and recessed below said front surface portion; and
a plurality of operator circuit communicating with said transceiver circuit and providing for the complete operation of said portable transceiver by the user, every control of said plurality of operator controls protruding through said control panel portion, said plurality of operator controls being symmetrically arranged within said recessed control panel portion and including a slide switch channel select control, a pushbutton push-to-talk control, a rotary switch on-off volume control and a rotary switch squelch control, said channel select control and said push-to-talk control being disposed on the longitudinal centerline of said portable transceiver and said two rotary switches being located symmetrically on opposite sides of said longitudinal centerline.

* * * * *